United States Patent [19]
Satoh

[11] Patent Number: 4,558,431
[45] Date of Patent: Dec. 10, 1985

[54] MEMORY SYSTEM FOR STORING ANALOG INFORMATION

[75] Inventor: Noboru Satoh, Tokyo, Japan

[73] Assignee: NEC Corporation, Tokyo, Japan

[21] Appl. No.: 560,308

[22] Filed: Dec. 12, 1983

[30] Foreign Application Priority Data

Dec. 10, 1982 [JP] Japan .................. 57-216701

[51] Int. Cl.$^4$ .............................. G11C 11/40
[52] U.S. Cl. ........................ 365/45; 365/189
[58] Field of Search ................. 365/45, 189, 230

[56] References Cited

U.S. PATENT DOCUMENTS 4,374,430  2/1983  Higuchi ...................... 365/45

Primary Examiner—Terrell W. Fears
Attorney, Agent, or Firm—Sughrue, Mion, Zinn, Macpeak & Seas

[57] ABSTRACT

The non-volatile semiconductor memory elements having an MIS structure show a hysteresis curve in the gate voltage-the threshold voltage characteristic. The continuously changing region of the hysteresis curve is used to operate the memory elements as analog memories. The input analog signal is applied to the gate electrode of a selected memory element after it is converted to have a voltage within the continuously changing region, to change the threshold voltage of the selected memory element. The changed threshold voltage is read out in read-out operation.

15 Claims, 5 Drawing Figures

MEMORY SYSTEM FOR STORING ANALOG INFORMATION

BACKGROUND OF THE INVENTION

1. Field of the Invention

This invention relates to a semiconductor memory system, and particularly to a memory system using a non-volatile semiconductor memory device for storing analog information.

2. Description of the Prior Art

The non-volatile semiconductor memory device in the prior art employs an MIS type memory transistor whose threshold voltage can be changed by injecting electric carriers into a gate insulator film or a floating gate or a bipolar memory transistor whose emitter junction is short-circuited by an input write signal applied externally. These memory transistors, however, store digital information only which consists of "1" or "0" value, and their use is limited to the digital information storage.

As memory devices in the prior art for storing analog information, there has been proposed a CCD (Charge Coupled Device) memory device which stores electric charges of different amounts in a semiconductor substrate under transfer gate electrodes. Since, however, the information storage in the CCD memory device is volatile, there is a limit in the storing time.

A use of non-volatile memory transistors in the analog information storage has been also proposed, in which an input analog information is once converted into digital information by an analog-to-digital (A/D) converter, and then digitally stored in the non-volatile memory transistors. The analog information is reproduced by reading the stored digital information and converting it into analog information with a digital-to-analog (D/A) converter. This memory system necessitates A/D and D/A converters and, therefore, is very complicated and expensive. Besides, the reproduced analog information through A/D conversion and D/A conversion is erroneous compared to the original input information.

SUMMARY OF THE INVENTION

Therefore, the principal object of the present invention is to provide a new non-volatile semiconductor memory system for storing analog information.

Another object of the present invention is provide a system for using MIS-type non-volatile memory transistors in analog information storage.

According to the present invention, there is provided a non-volatile memory system comprising a means for normalizing an input analog signal to be stored into a voltage within a predetermined voltage range, a non-volatile insulated-gate field-effect memory transistor, the threshold voltage of the memory transistor being changed continuously in response to the voltage applied to the gate electrode thereof when the voltage applied to the gate electrode is within the mentioned predetermined voltage range, means for applying the normalized voltage to the gate electrode of the memory transistor to change the threshold voltage of the memory transistor and means for reading the information stored in the memory transistor, the reading means including means for detecting the changed threshold voltage of the memory transistor. The detecting means may comprise a first means for applying a varying voltage to the gate electrode of the memory transistor, a second means for detecting that the memory transistor reaches a threshold state between the non-conductive state and the conductive state by the varying voltage, and a third means for determining the value of the varying voltage when the memory transistor reaches the threshold state.

There is further provided a memory system which comprises a memory section including a plurality of non-volatile, insulated gate field effect memory transistors, an address selector selecting a memory transistor in accordance with an address information, the address selector being composed of MIS type transistors, a voltage converter composed of bipolar transistors and converting a voltage of an input analog signal to a voltage within a voltage range, the threshold voltage of the memory transistor being changed continuously in response to its gate voltage so long as the gate voltage is within the mentioned voltage range, a means for applying the output of the voltage converter to the gate electrode of the memory transistor selected by the address selector to change the threshold voltage of the selected transistor, and a detection circuit composed of bipolar transistors for detecting the changed threshold voltage of the memory transistor. The detection circuit may comprise a varying voltage generator producing a sawtooth wave voltage as the read-out voltage, a means for applying the varying voltage to the gate electrode of the memory transistor in reading out the stored information, a means for detecting a time point when the current starts to flow through the memory transistor to be read out in response to the varying voltage applied to the gate electrode of the memory transistor, a means for detecting the voltage value at the gate electrode at the detected time point, and a means for stopping applying the varying voltage to the gate electrode of the memory transistor to be read out.

MIS type non-volatile semiconductor memory element presents a hysteresis characteristic between the applied gate voltage and the threshold voltage. The hysteresis characteristic curve includes a continuously changing, linear region. The present invention utilizes this continuously changing region of the gate voltage vs. threshold voltage curve ofthe MIS type non-volatile semiconductor memory element for analog information storage.

According to the present invention, the voltage of the input analog signal is once converted to a voltage within a voltage range in which the relationship between the gate voltage and the threshold voltage is continuous, ideally linear, and then applied to the gate electrode of the memory transistor to change its threshold voltage. Since the memory transistor is of the non-volatile type, the change in the threshold voltage is retained for a very long period of time.

To read-out the information stored in the memory transistor, a varying voltage, such as a saw-tooth wave voltage, which continuously or continually changes from low to high, is applied to the gate electrode of the memory element to be read out. The gate voltage is detected when a current starts flowing through the memory element. At the same time, the application of the varying voltage to the gate electrode of the memory element is stopped. The MIS type memory element does not change its threshold voltage by application of a voltage having the threshold voltage to the gate electrode. Therefore, the stored information is not destroyed when it is read out.

The memory system may be realized in a semiconductor integrated circuit. In such case, the voltage converter and the threshold voltage detecting means which process the analog signals are formed of bipolar transistors, while the address selector and the timing generator which process the digital signals are composed of insulated-gate field effect transistors (MIS FET's), therefore, the input analog signal is treated with a very small distortion. The power consumed in the memory system is minimized by the use of the MIS FET's in the digital signal processing portion.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED INVENTION

Figure 1:
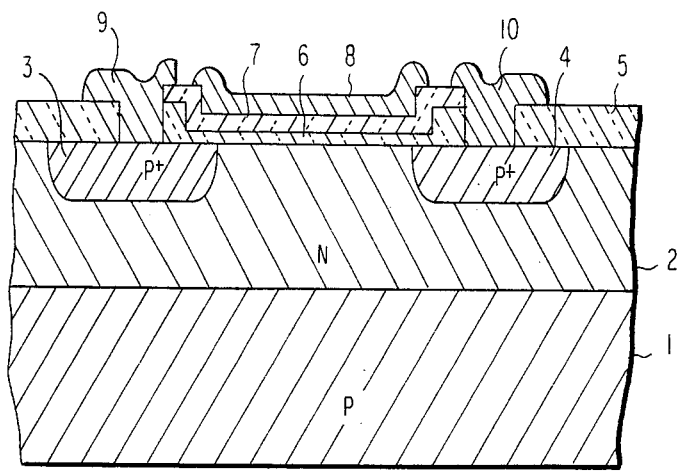
FIG. 1 is a cross-sectional view of MNOS type field effect transistor used as a non-volatile semiconductor memory transistor.

Among the insulated gate field effect transistors used as a non-volatile semiconductor memory transistor, there is an MNOS type memory transistor shown in FIG. 1. This memory transistor has a double layer gate insulator of a silicon oxide layer 6 and a silicon nitride layer 7. The other structure are the same as the well-known MIS FET.

An N-type silicon epitaxial layer 2 having an impurity concentration of 4 to $6 \times 10^{14}$ cm$^{-3}$ is grown on a P-type silicon substrate 1 having an impurity concentration of 6 to $8 \times 10^{14}$ cm$^{-3}$. A P+ source region 3 and P+ drain region 4 having an impurity concentration of 1 to $2 \times 10^{19}$ cm$^{-3}$ are formed in the silicon epitaxial layer 2 by an impurity diffusion technique. At the surface of the silicon epitaxial layer 2, a thick field oxide layer 5 of silicon dioxide is provided. The field oxide layer 5 above a portion between the source and drain regions 3 and 4 is replaced with a thin oxide layer 6 of silicon dioxide having a thickness of 20 to 24 Å. A nitride layer 7 of silicon nitride having a thickness of 400 to 700 Å is provided on the thin oxide layer 6. If the thickness of the oxide and nitride layers 6 and 7 are made thicker, the gate voltage necessary for storing analog information becomes higher. Therefore, these thickness ranges of the thin oxide layer 6 and the nitride layer 7 are selected to store analog information by a gate voltage up to 40 volts which is an upper limit of voltage practically applicable to a semiconductor integrated circuit without any breakdown in the integrated circuit. A gate electrode 8 of aluminum layer having a thickness of 1.2 μm is formed on the nitride layer 7.

That is, the thin oxide layer 6 and the nitride layer 7 form a gate insulator of a field effect transistor. Furthermore, the field oxide layer 5 has apertures above the source and drain regions 3 and 4. A source electrode 9 and a drain electrode 10 are formed in these apertures and extended on the field oxide layer 5 to form a predetermining circuit wiring.

Figure 2:
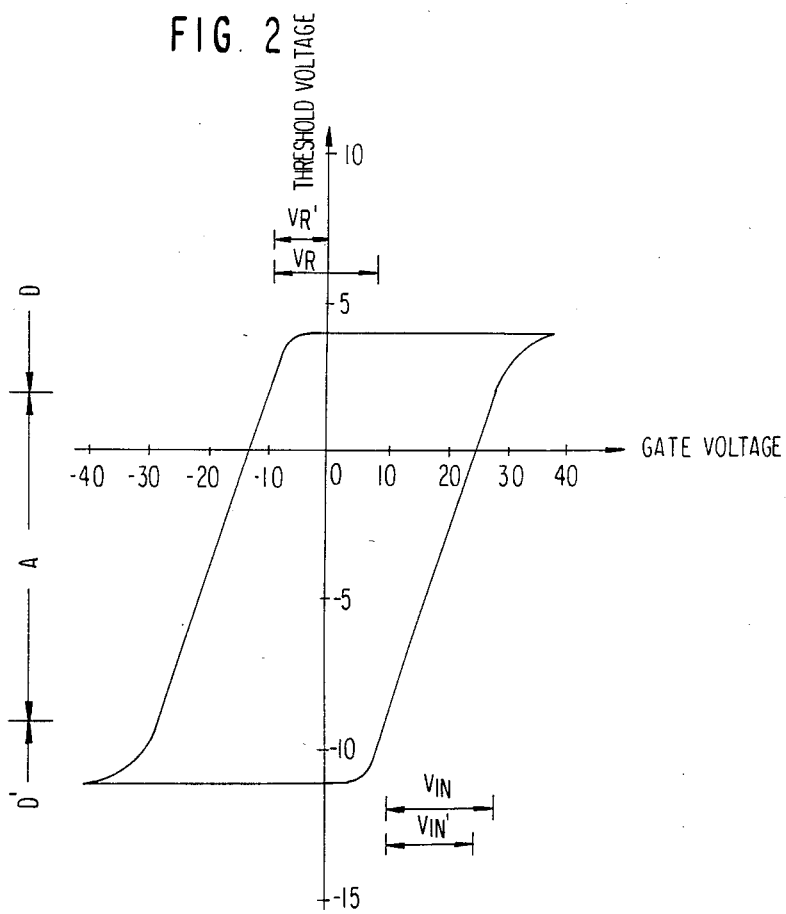
FIG. 2 is a graphic view showing a relationship of the memory transistor shown in FIG. 1, between a gate voltage applied to the gate electrode and the threshold voltage obtained by the gate voltage.

An electrical characteristic showing a relationship between the gate voltage and the threshold voltage of the MNOS memory transistor having the oxide layer 6 of 20 Å and the nitride layer 7 of 400 Å is illustrated in FIG. 2. The abscissa is the gate voltage applied to the gate electrode 8 and the ordinate is the threshold voltage of the memory transistor. The characteristic curve presents a hysteresis curve. By applying a gate voltage, by which the threshold voltage saturates, to the gate electrode 8, the memory transistor can be used as a digital memory. The threshold voltage ranges usable as the digital memory are ranges D and D'. The threshold voltage range A between the ranges D and D' is a range where the gate voltage and the threshold voltage have a linear relationship therebetween. That is, the memory transistor can be used as an analog memory by using this within the range A. The gate voltage range usable as an analog memory is described in FIG. 2 by "$V_{IN}$". The example shown in FIG. 2 has the gate voltage range $V_{IN}$ between +10 to +28 volts. The threshold voltage range corresponding to the gate voltage range $V_{IN}$ is from −9 volts to +2.5 volts.

Practically, if the threshold voltage changes its polarity, the memory system requires very complicated control circuit of the memory transistor. It is very difficult to construct the control circuit in a form of semiconductor integrated circuit. Therefore, the gate voltage range $V_{IN}$ is preferably selected as a range $V_{IN}'$ where the corresponding threshold voltage does not change its polarity. This preferable gate voltage range $V_{IN}'$ is between +10 and +25 volts in the example shown in FIG. 2.

The analog information thus stored is read out by applying a saw-tooth wave voltage continuously rising an voltage from "0" volt to the gate electrode 8 and detect the gate voltage at a time point when current starts flowing through the source and drain regions 3 and 4 of the memory transistor. The voltage range applied to the gate electrode 8 to read out the stored information is shown in FIG. 2 with "$V_R$". However, this range $V_R$ is theoretical range. Because, the gate voltage is preferably applied not to change the polarity of the threshold voltage, the practical voltage range $V_R'$ is between 0 to −10 volts for the memory transistor shown in FIGS. 1 and 2.

Here, the threshold voltage corresponding to the voltage range $V_R$ or $V_R'$ is kept saturated. Therefore, the application of the voltage in the range $V_R$ or $V_R'$ to the gate electrode 8 does not change the threshold voltage of the memory transistor. This means the stored information never changes by the read-out operation.

Figure 3:
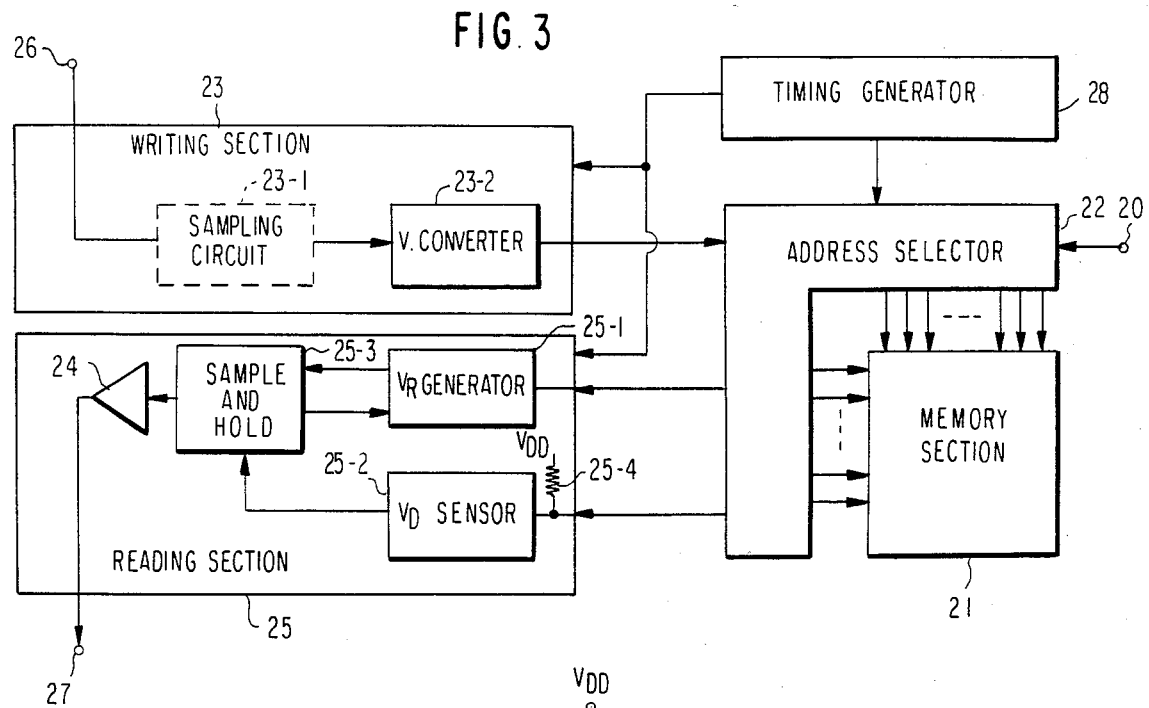
FIG. 3 is a block diagram showing a memory system according to a preferred embodiment of the present invention.

An analog memory system operating in the above is embodied in FIG. 3. A memory section 21 has a plurality of memory transistors of an MIS type field effect transistor. One example of the memory transistor is a memory transistor shown in FIG. 1. The memory transistor are arranged in rows and columns to form a matrix. The predetermined one of the memory transistors is selected by the address selector 22 in accordance with an address information applied to an address input terminal 20. The writing and reading the analog information into and from the predetermined memory transistor are done by a writing section 23 and a reading section 25 under a timing control achieved by pulses generated from a timing generator 28.

The information to be stored is inputted from an input terminal 26. If the input information is continuous information such as a sign wave signal, the input information is sampled by a sampling circuit 23-1 with the timing pulse generated from the timing generator 28 and then applied to a voltage converter 23-2. Otherwise, the input information is directly applied to the voltage converter 23-2. The sampling circuit 23-1 may be omitted in the later case.

The voltage converter 23-2 converts the voltage of the input information to a voltage within a gate voltage range $V_{IN}'$ of FIG. 2 where the gate voltage and the threshold voltage keep a linear relationship. The output from the voltage converter 23-2 is applied to the address selector 22 to be written in the memory transistor selected by the address selector 22 under the control of the timing pulse generated by the timing generator 28.

Figure 4:
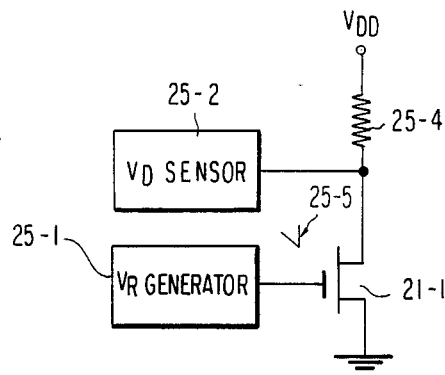
FIG. 4 is a circuit diagram showing a method for reading out the analog information stored in the memory element.

For the reading operation, the memory transistor selected by the address selector 22 is connected with the reading section 25. The circuit connection for reading operation is schematically shown in FIG. 4. The source electrode of the memory transistor 21-1 is grounded, the drain electrode is connected to a power source $V_{DD}$ through a resistor 25-4 and to a drain voltage ($V_D$) sensor 25-2 and the gate electrode is connected to a read-out voltage ($V_R$) generator 25-1. The read-out voltage generator 25-1 applies the read-out voltage of a saw-tooth wave signal 25-5. The saw-tooth wave signal 25-5 has a ramped voltage which starts from "0" volt and increases in the negative polarity. When the voltage of the saw-tooth wave signal reaches the threshold voltage of the selected memory transistor 21-1, the drain voltage sensor 25-2 detects a drop in the voltage at the drain electrode. The voltage of the saw-tooth wave signal when the voltage at the drain electrode drops is detected by a sample and hold circuit 25-3 and then applied to an amplifier 24. The output from the amplifier 24 is derived from the output terminal 27 as an output analog signal. At the same time when the drain voltage sensor 25-2 detects the voltage drop, the sample and hold circuit 25-3 controls the read-out voltage generator 25-1 to stop the application of the saw-tooth wave signal 25-5 to the gate electrode of the selected memory transistor 21-1.

Figure 5:
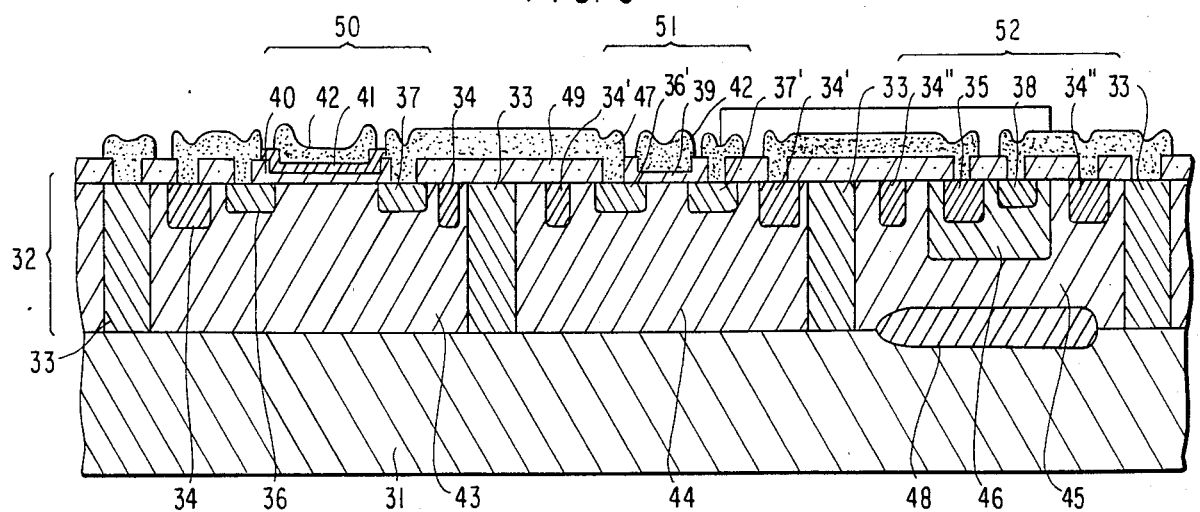
FIG. 5 is a cross-sectional view showing structures of a memory transistor, an MIS FET and a bipolar transistor used in a semiconductor integrated circuit embodying the memory system shown in FIG. 3.

All the sections of the memory system in FIG. 3 may be formed in a single semiconductor integrated circuit. Alternatively, the writing section 23 may be omitted from the semiconductor integrated circuit or only the voltage converter 23-1 in the writing section 23 may be added to the semiconductor integrated circuit in which the memory section 21, the address selector 22, the timing generator 28 and the reading section 25 are formed. In such semiconductor integrated circuit, the address selector 22 and the timing generator 28 are formed of MIS FET's and other passive elements, and other reading section 25 and the necessary writing section 23 or voltage converter 23-1 are of bipolar transistors and passive elements. This structure will be explained with reference to FIG. 5. The sectional view of FIG. 5 is a view only for explaining the combination of MNOS type memory transistors, MIS FET's and bipolar transistors used in the above-mentioned semiconductor integrated circuit, and therefore, the circuit wiring does not coincide with the actual semiconductor integrated circuit.

An N-type silicon epitaxial layer 32 having an impurity concentration of 4 to $6 \times 10^{14}$ cm$^{-3}$ is grown on a P-type silicon substrate 31 having an impurity concentration of 6 to $8 \times 10^{14}$ cm$^{-3}$. In this epitaxial layer 32, P-type impurities are diffused with an impurity concentration of 8 to $20 \times 10^{18}$ cm$^{-3}$ to form a P-type insulation layer 33. The insulation layer 33 divides the epitaxial layer 32 into a plural number of regions 43, 44 and 45. The region 43 is for the memory section 21. A plurality of memory transistors are formed in the region 43. The region 44 is for forming the address selector 22 and the timing generator 28 with MIS FET's and passive elements. The region 45 is for forming the reading section 25, for forming the writing and reading sections 23 and 25 or for forming the reading section 25 and the voltage converter 23-2 with bipolar transistors and passive elements.

Each memory element 50 has P-type source and drain regions 36 and 37 of an impurity concentration of 1 to $2 \times 10^{19}$ cm$^{-3}$ and an N$^+$-type channel stopper region 34 surrounding the source and drain regions 36 and 37 with an impurity concentration of 1 to $2 \times 10^{19}$ cm$^{-3}$. While the surface of the epitaxial layer 32 is covered with a thick silicon oxide layer 49, at the surface between the source and drain regions 36 and 37, a thin silicon oxide layer 40 of 20 to 24 Å and a silicon nitride layer 41 of 400 to 700 Å are formed as a gate insulator film on which an aluminum gate electrode 41 is formed. The source and drain regions 36 and 37 and the channel stopper region 34 is respectively wired by aluminum wiring layers 37 through apertures formed in the thick oxide layer 49 thereabove.

An MIS FET 51 is formed in the region 44. Source and drain regions 36' and 37' are formed in the same way as the memory transistor 50. A gate insulator film is formed on the region between the source and drain regions 36' and 37' with a silicon oxide layer 39 having a thickness of 2300 Å. An aluminum gate electrode 42 is formed on the silicon oxide layer 39. An N$^+$-type channel stopper region 34' is also formed to surround the source and drain regions 36' and 37'. The necessary wirings to the source and drain regions 36' and 37' and the gate electrode 42 are formed with the aluminum wiring layer 47.

A bipolar transistor 52 is formed in the region 45. While the above-mentioned memory transistor 50 and the MIS FET 51 may be respectively formed in the same regions 50 and 51 with a plurality number, a single bipolar transistor 52 is formed in the region 45. Therefore, a plurality of regions 45 should be formed in the epitaxial layer 32 to form bipolar transistors of a number necessary to form the reading section 25, the writing section 23 or the voltage converter 23-1.

In the region 45, an N$^+$-type buried layer 48 is formed at the boundary between the silicon substrate 31 and the epitaxial layer 32. A P-type base region 46 is formed in the epitaxial layer 32 and a P$^+$-type base contact region 38 and an N$^+$-type emitter region 35 are in turn formed in the base region 46. The P$^+$-type base contact region 38 has an impurity concentration of 1 to $2 \times 10^{19}$ cm$^{-3}$ and the N$^+$-type emitter region 35 has an impurity concentration of 1 to $2 \times 10^{19}$ cm$^{-3}$. The channel stopper region 34" surrounds the base region 46 and is formed to serve as a collector contact region. The necessary wirings to the emitter region 35, the base contact region 38 and the collector contact region (34") are formed by the aluminum wiring layer 47.

According to the present invention, a non-volatile analog memory is realized in a form of semiconductor integrated circuit. The stored analog information may be read out without destroying the stored information. This memory protection against the read-out operation is ensured by changing the read-out voltage applied to the memory transistor to a ground level in response to the detection of the current flowing through the memory transistor. The writing and reading sections are constructed by bipolar transistors and other passive elements, resulting in that the input and output analog signals may be processed with very small distortion. Further, the address selector and the timing generator are constructed by MIS FET's and other passive elements, resulting in a small power consumption.

Although one preferred embodiment of the present invention is explained above, it will be apparent that any non-volatile memory transistors of MIS type, for example, as stacked gate MIS memory FET with a floating gate electrode, can be used in place of the above-explained MNOS type memory transistors. The conductivity type of the silicon epitaxial layer can be changed from the N-type to the P-type by changing the polarities of the MIS FET's, the bipolar transistors and the power supply voltage.

What is claimed is:

1. A memory system for storing analog information comprising a memory section including a plurality of non-volatile, insulated-gate field-effect memory transistors, the threshold voltage of said memory transistor being changed continuously in response to the gate voltage thereof so long as said gate voltage is within a predetermined voltage range, an input terminal for receiving an input signal having said analog information, a voltage converter converting said input signal to have a voltage within said predetermined voltage range, a first means for applying said converted input signal to a selected first one of said memory transistors to change the threshold voltage of the selected first memory transistor in accordance the voltage of said converted input signal, and a second means for reading the analog information stored in said memory transistors, said second means including means for detecting the changed threshold voltage of a selected second one of said memory transistors.

2. The memory system as claimed in claim 1, in which said detecting means includes a means for applying a varying voltage to the gate electrode of said selected second memory transistor and means for determining the voltage value at the gate electrode of said selected second memory transistor when a current starts flowing through said selected second memory transistor by said varying voltage.

3. The memory system as claimed in claim 1, wherein each of said memory transistors has a gate insulator of a silicon oxide film and a silicon nitride film deposited on said silicon oxide film.

4. The memory system as claimed in claim 1, wherein said predetermined voltage range is a gate voltage of said memory transistor where said threshold voltage changes linearly but does not change its polarity.

5. The memory system as claimed in claim 2, wherein said second means further includes means for stopping the application of said varying voltage to the gate electrode of said selected second memory transistor when the current starts flowing through said selected second memory transistor.

6. The memory system as claimed in claim 2, further comprising a sampling circuit connected between said input terminal and said voltage converter for sampling said input signal with a predetermined timing.

7. A method for employing a non-volatile semiconductor memory element having a structure of an insulated gate field effect transistor as an analog memory, comprising steps of converting an input signal having analog information to have a voltage in a predetermined range, said predetermined range corresponding to a gate voltage range of said memory element where the threshold voltage of said memory changes linearly in accordance with the voltage applied to the gate electrode of said memory element, applying said converted input signal to said gate electrode of said memory element to memorize said analog information in said input signal into said memory element, and reproducing said analog information from said memory element, said reproducing step including processes of applying a various voltage to said gate electrode of said memory element and deriving said voltage at said gate electrode as an output signal when a current starts flowing through said memory element.

8. The method for using a non-volatile semiconductor memory element as claimed in claim 7, wherein said memory element has a gate insulator of a silicon oxide film and a silicon nitride film deposited on said silicon oxide film.

9. The method for using a non-volatile semiconductor memory element as claimed in claim 7, wherein said reproducing step further comprises a process of stopping the application of said various voltage to said gate electrode when said current starts flowing through said memory element.

10. The method for using a non-volatile semiconductor memory element as claimed in claim 7, wherein said current is detected by a voltage change at the drain electrode of said memory element.

11. A memory system for storing analog information comprising a memory section including a plurality of insulated-gate field-effect memory transistors, a first input terminal for receiving an input signal having said analog information, a voltage converter for converting the voltage of said input signal to a voltage within a predetermined range, said predetermined range corresponding to a range of the gate voltage of said memory transistor which continuously changes the threshold voltage of said memory transistor, said voltage converter being formed of bipolar transistors and passive elements, a second input terminal for receiving an address signal, an address selector for selecting one of said memory transistors in accordance with said address signal, said converted input signal being applied to the gate electrode of said selected memory transistor to change the threshold voltage of said memory transistor, said address selector being formed of insulated-gate field-effect transistors and passive elements, a detection circuit formed of bipolar transistors and passive circuit elements for detecting the changed threshold voltage of said selected memory transistor.

12. The memory system as claimed in claim 11, wherein said detection circuit includes means for applying a varying voltage to the gate electrode of said selected memory transistor, means for detecting that a current starts flowing through said selected memory transistor by said varying voltage, and means for determining the voltage value of said varying voltage at the gate electrode of said selected memory transistor which causes said current to flow.

13. A memory system as claimed in claim 11, wherein each of said memory transistors has a gate insulator of a silicon oxide film and a silicon nitride film deposited on said silicon oxide film.

14. A memory system as claimed in claim 11, further comprising a sampling circuit inserted between said first input terminal and said voltage converter for sampling said input signal with a predetermined timing, said sampling circuit being formed of bipolar transistors and passive elements.

15. A memory system as claimed in claim 14, further comprising an amplifier coupled to said detection circuit for amplifying the voltage of the determined voltage value.

* * * * *